United States Patent [19]

Banerjee

[11] Patent Number: 4,634,039
[45] Date of Patent: Jan. 6, 1987

[54] SOLDER RESIST PASTE AND METHOD OF SOLDERING

[75] Inventor: Hari N. Banerjee, Rexdale, Canada

[73] Assignee: Northern Telecom Limited, Montreal, Canada

[21] Appl. No.: 662,916

[22] Filed: Oct. 19, 1984

[51] Int. Cl.$^4$ .......................... B23K 1/20; B23K 31/02
[52] U.S. Cl. ..................................... 228/118; 228/215; 427/259; 106/2
[58] Field of Search .................... 228/118, 215; 106/2; 427/259

[56] References Cited

U.S. PATENT DOCUMENTS

| | | | |
|---|---|---|---|
| 3,036,118 | 5/1962 | Jackson | 564/224 |
| 3,066,390 | 12/1962 | Jack | 228/118 |
| 3,553,158 | 1/1971 | Gilfillan | 106/308 Q |
| 3,899,339 | 8/1975 | Peters | 106/2 |
| 4,120,843 | 10/1978 | Ameen | 228/118 |
| 4,127,692 | 11/1978 | Boynton | 228/170 |
| 4,177,303 | 12/1978 | Clipston | 427/259 |
| 4,283,480 | 8/1981 | Davies | 228/215 |
| 4,390,615 | 6/1983 | Courtney | 228/118 |
| 4,398,660 | 8/1983 | Pampalone | 228/180.2 |

FOREIGN PATENT DOCUMENTS 2404240 8/1974 Fed. Rep. of Germany ...... 228/118
1144989 7/1967 United Kingdom .

Primary Examiner—Kenneth J. Ramsey
Assistant Examiner—Christopher L. McKee
Attorney, Agent, or Firm—Robert C. Hogeboom

[57] ABSTRACT

A solder resist paste having the feature that it is relatively easily removed is disclosed. The paste is comprised of a liquid polyglycol (e.g. Pluronic 25R2 by BASF) and either Kaoline or talc powder. In operation, the paste is selectively applied to holes in the PCB which it is desired to keep open during a soldering process. The paste is then washed out of the holes, additional components mounted via those holes, and soldered into place.

2 Claims, No Drawings

SOLDER RESIST PASTE AND METHOD OF SOLDERING

This invention relates generally to solder resists and more particularly to a solder resist that can be readily removed.

BACKGROUND OF THE INVENTION

In the manufacturing of electronic devices it is well known to mount electrical or electronic components to a PCB (printed circuit board) and to wave (or flow) solder the components to the board. Some of the components to be mounted to the PCB are more heat sensitive than others and they cannot withstand the high temperatures involved with the wave soldering process. As a consequence, these components are not initially placed on the PCB; rather, the other components are placed on the PCB and the PCB is wave soldered. Next, the heat sensitive components are placed on the PCB and are hand soldered into position.

This procedure has at least one drawback. During the initial wave soldering stage the holes that are to accept the heat sensitive components become blocked with solder. As a result, it is difficult, if not impossible, to insert the leads of the heat sensitive components.

To overcome this problem, a temporary solder resist is applied to the PCB, at those locations that components will not be soldered during the initial wave soldering step. After the wave soldering step, and before inserting the heat sensitive components, the temporary solder resist is removed. The heat sensitive components are then inserted and hand soldered.

SUMMARY OF THE INVENTION

The present invention is directed to producing a temporary solder resist paste that is easy to remove. In one embodiment the solder resist is composed of 3.5 liters of 25R2 (a Pluronic R polyol by BASF) and 4.0 Kg of kaolin. More details of the Pluronic R polyols can be found in U.S. Pat. No. 3,036,118.

In other terms, the present invention is a solder resist paste comprising approximately 45% to 50% by weight of a polyglycol and the remainder being either kaolin or talc.

Stated in yet other terms, the present invention is a method of soldering components to a PCB (printed circuit board), the method characterized by: selectively applying a temporary solder resist comprised of a polyglycol and either kaolin or talc powder to at least one hole in the PCB; selectively situating first components on the PCB either on the surface of the PCB or into holes other than the holes containing the solder resist; soldering the first components to the PCB; washing the PCB with a solvent in which the solder resist is soluble and which is not harmful to either the PCB or the first components; selectively situating second components on the PCB employing the holes that had previously held the solder resist; and soldering the second components to the PCB.

DETAILED DESCRIPTION

The present invention is a material composed of a Pluronic R polyol in combination with either kaolin or talc (or some combination thereof). The preferred form has the proportions of 3.5 liters of 25R2 (by BASF) to 4.0 Kg of kaolin. An alternative form is 3.5 liters of 25R2 and 4.0 Kg of talc. This produces a material having a specific gravity of approximately 1.45. The constituent components by percentage weight are approximately 48% 25R2 (since it has a specific gravity of approximately 1.039) and 52% kaolin.

The material is formed by combining the 25R2 in liquid form with either powdered talc or powdered kaolin. Mechanical mixing at room temperature is all that is required. The end result is a paste that can be applied to the PCB.

The resulting solder resist material is a thixotropic paste, having a consistency, in its preferred embodiments, not unlike that of tooth-paste. It can be removed by washing with freon TMS or by washing with hot water (with or without a detergent).

The paste can be applied to a printed circuit board either by a screening method or by dispensing from a caulking cartridge using a pneumatic system. In its preferred form it has a specific gravity of approximately 1.45 and a viscosity of approximately 400,000 to 500,000 cps (Brookfield viscometer, spindel=TF, speed=10 RPM).

The range of the constituent materials is not critical and can vary between approximately 45% and 50% polyglycol depending upon the desired viscosity of the resultant paste.

In operation, the paste made according to the present invention is inserted into selected holes on the PCB. The paste does not normally cover the pad (or land) area surrounding the hole; consequently, during the initial wave soldering operation the pad becomes coated with solder, but the solder does not block the hole.

After the initial wave soldering step, the PCB is washed with a fluorocarbon solvent (e.g. freon TMS) to remove the temporary solder resist material. The hole in the PCB is now free to receive the lead of a component for mounting purposes.

What is claimed is:

1. A method of soldering components to a PCB (printed circuit board), said method characterized by:
   selectively applying a temporary solder resist consisting of a polyglycol and either kaolin or talc powder to at least one hole in said PCB;
   selectively situating first components on said PCB either on the surface of said PCB or into holes other than the holes containing said solder resist;
   soldering said first components to said PCB;
   washing said PCB with a solvent in which said solder resist is soluble and which is not harmful to either said PCB or said first components;
   selectively situating second components on said PCB employing holes that had previously held said solder resist; and
   soldering said second components to said PCB.

2. The method of claim 1 wherein said polyglycol is a nonionic surfactant polyol.

* * * * *